(12) United States Patent
Kim et al.

(10) Patent No.: US 8,659,111 B2
(45) Date of Patent: Feb. 25, 2014

(54) SEMICONDUCTOR DEVICE AND METHOD FOR MANUFACTURING THE SAME

(75) Inventors: Jae Young Kim, Anyang (KR); Mi Hyune You, Cheongju (KR)

(73) Assignee: Hynix Semiconductor Inc., Icheon (KR)

( * ) Notice: Subject to any disclaimer, the term of this patent is extended or adjusted under 35 U.S.C. 154(b) by 59 days.

(21) Appl. No.: 13/327,614

(22) Filed: Dec. 15, 2011

(65) Prior Publication Data

US 2012/0153456 A1 Jun. 21, 2012

(30) Foreign Application Priority Data

Dec. 15, 2010 (KR) .................. 10-2010-0128572

(51) Int. Cl.
*H01L 21/70* (2006.01)
(52) U.S. Cl.
USPC .......................................................... 257/499
(58) Field of Classification Search
None
See application file for complete search history.

(56) References Cited

U.S. PATENT DOCUMENTS

| | | | | |
|---|---|---|---|---|
| 2009/0004839 A1* | 1/2009 | Eun | .................. | 438/597 |
| 2011/0024811 A1* | 2/2011 | Kim | .................. | 257/296 |

FOREIGN PATENT DOCUMENTS

| | | | |
|---|---|---|---|
| KR | 1020060128349 A | 12/2006 |
| KR | 1020080061856 A | 7/2008 |

* cited by examiner

*Primary Examiner* — Steven Loke
*Assistant Examiner* — Junaiden Mirsalahuddin

(57) ABSTRACT

A semiconductor device is manufactured by etching a semiconductor substrate including an active region, forming a bit line contact hole from which the active region is protruded, forming a first spacer exposing a top of the active region at each of an inner wall and a bottom of the bit line contact hole, forming a bit line contact plug and a bit line over the exposed active region, and forming a second spacer over the semiconductor substrate including not only the bit line contact plug but also the bit line.

12 Claims, 7 Drawing Sheets

SEMICONDUCTOR DEVICE AND METHOD FOR MANUFACTURING THE SAME

CROSS-REFERENCE TO RELATED APPLICATION

The priority of Korean patent application No. 10-2010-0128572 filed on 15 Dec. 2010, the disclosure of which is hereby incorporated in its entirety by reference, is claimed.

BACKGROUND OF THE INVENTION

Embodiments of the present invention relate to a semiconductor device and a method for manufacturing the same, and more particularly to a semiconductor device including a Global Bit Line (GBL) and a method for manufacturing the same.

In recent times, technologies of 40 nm or less have been applied to semiconductor devices so that a Global Bit Line (GBL) process has been proposed. However, if misalignment between a bit line contact and a bit line occurs, the GBL process unavoidably generates a poor self-aligned contact (SAC) between a bit line contact and a storage node contact. If a thick bit line spacer is formed to solve the above-mentioned problem, a Not-Open phenomenon of a storage node contact occurs. In addition, if the bit line contact spacer is formed thick, resistance of the bit line contact is increased. In order to prevent the increasing resistance of the bit line contact, an inner GBL process has been proposed. However, the inner GBL process is disadvantageous in that it makes difficult a SAC contact process, and increases parasitic capacitance (Cb) between the bit line and a plate electrode. Increased parasitic capacitance (Cb) has a negative influence upon a sensing margin of the entire semiconductor device, resulting in deterioration of device characteristics.

BRIEF SUMMARY OF THE INVENTION

Various embodiments of the present invention are directed to providing a semiconductor device and a method for manufacturing the same that substantially obviate one or more problems due to limitations and disadvantages of the related art.

An embodiment of the present invention relates to a semiconductor device and a method for manufacturing the same, which can improve a process for forming an inner bit line so as to improve device characteristics.

In accordance with an aspect of the present invention, a semiconductor device includes a bit line contact hole including a protruded active region; a first spacer formed over a sidewall and bottom of the bit line contact hole so as to expose a top of the active region; a bit line contact plug and a bit line formed over the exposed active region; and a second spacer formed over the semiconductor substrate including not only the bit line contact plug but also the bit line.

Each of the first spacer and the second spacer may include a nitride film.

The first spacer formed over the bottom of the bit line contact hole may be formed to be level to the protruded active region.

A critical dimension (CD) of the bit line contact hole may be larger than a short-axis-directional CD of the active region. A critical dimension (CD) of the bit line contact plug may be smaller than a CD of the bit line contact hole.

The bit line contact plug may include polysilicon. The bit line may be formed in a laminated structure of a barrier metal layer, a bit line conductive layer, and a hard mask layer.

The second spacer may fill a space between the bit line contact plug and the bit line contact hole.

The portion of the first spacer formed over the bottom of the bit line contact hole may be formed to have a larger thickness than the portion of the first spacer formed over the sidewall of the bit line contact hole.

In accordance with another aspect of the present invention, a method for manufacturing a semiconductor device includes etching a semiconductor substrate including an active region, and forming a bit line contact hole from which the active region is protruded; forming a first spacer exposing a top of the active region over sidewalls and a bottom of the bit line contact hole; forming a bit line contact plug and a bit line over the exposed active region; and forming a second spacer over the semiconductor substrate including not only the bit line contact plug but also the bit line.

In the forming of the bit line contact hole, a critical dimension (CD) of the bit line contact hole may be larger than a short-axis-directional CD of the active region.

The forming of the first spacer may include depositing an insulation film in the bit line contact hole including the protruded active region; and performing an etch process until the top of the protruded active region is exposed, so that the insulation film remains over an sidewall and bottom of the bit line contact hole.

The etch process may be a lateral etch process. The lateral etch process may be performed using a Light Etch Treatment (LET) scheme. The lateral etch process may be performed using a wet etch scheme. The etch process may be performed using a gas including any of $SF_6$, $O_2$, $N_2$, HBr and a combination thereof.

The forming of the bit line contact plug and the bit line may include forming a polysilicon layer, a barrier metal layer, a bit line conductive layer, and a hard mask layer over the bit line contact hole in which the first spacer is formed; forming a mask pattern defining a bit line over the hard mask layer; and etching the hard mask layer, the bit line conductive layer, the barrier metal layer, and the polysilicon layer using the mask pattern defining the bit line as an etch mask.

The barrier metal layer may be formed of any of a titanium (Ti) film, a titanium nitride (TiN) film, and a combination thereof. The bit line conductive layer may be formed of a material including tungsten (W). The bit line hard mask layer may be formed of a material including a nitride film.

In the etching of the polysilicon layer, the polysilicon layer may be the bit line contact plug. In the forming of the second spacer, the second spacer may be formed to bury the bit line contact hole formed over sidewalls of the bit lie contact plug.

The insulation film may be formed of a material including a nitride film. The method may further include, after forming the second spacer, forming a storage node contact plug adjacent to the bit line.

In accordance with another aspect of the present invention, A semiconductor device comprising: a trench disposed in a substrate, wherein a bottom of the trench is at a first level, an uplifted active region disposed in the trench, wherein a top of the uplifted active region is at a second level higher than the first level, a bit line pattern disposed over the uplifted active region and coupled to the uplifted active region, a first spacer disposed over a bottom of the trench and extending over a sidewall of the trench, wherein a top of the first spacer formed over the bottom of the trench is at a third level, and a second spacer disposed between the first spacer and the bit line pattern. The third level is substantially the same as the second level.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the accompanying drawings.

FIGS. 1A to 1D are cross-sectional views illustrating a general semiconductor device and a method for forming the same according to the related art.

Figure 1A:
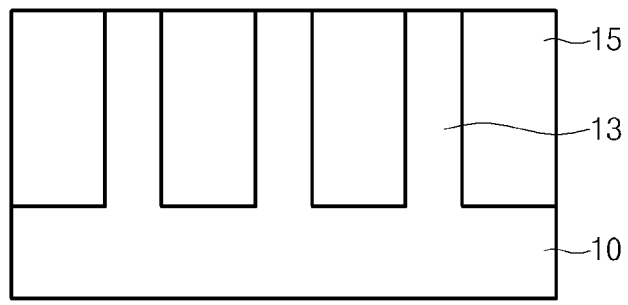
FIGS. 1A to 1D are cross-sectional views illustrating a general semiconductor device and a method for manufacturing a semiconductor device according to the related art.
Figure 1B:
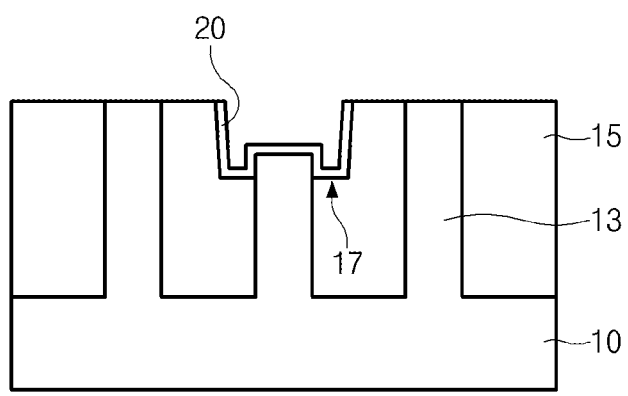

Referring to FIG. 1A, a device isolation trench defining an active region 13 is formed by etching a semiconductor substrate 10. An oxide film fills the device isolation trench so that a device isolation film 15 is formed. Referring to FIG. 1B, the semiconductor substrate 10 including the active region 13 and the device isolation film 15 is etched so that a bit line contact hole 17 is formed. In this case, an active region 13 protrudes from a center part of the bit line contact hole 17 is formed because of a difference in etch selection ratio between the active region 13 and the device isolation film 15. Subsequently, a spacer insulation film 20 is deposited along the protruded active region 13 and an inner surface of the bit line contact hole 17. The spacer insulation film 20 may be formed of a nitride film.

Figure 1C:
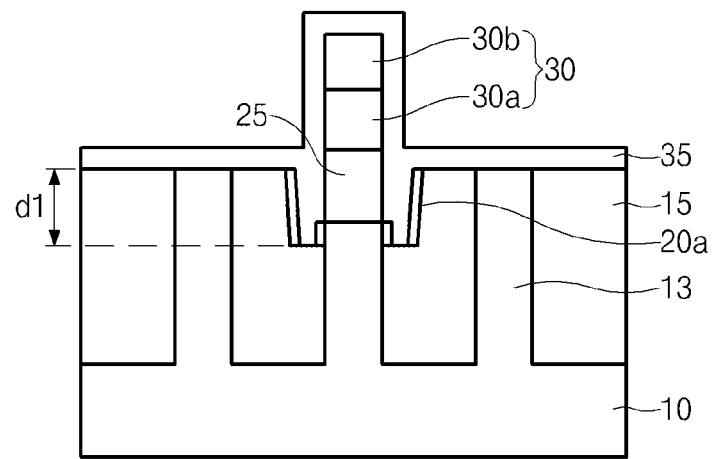

Referring to FIG. 1C, the spacer insulation film 20 is etched by an etch-back process, so that a spacer 20a is formed at an inner wall of the bit line contact hole 17 and sidewalls of the protruded active region 13. A laminated structure of a polysilicon layer, a barrier metal layer (not shown), a bit line conductive layer 30a, and a bit line hard mask layer 30b is formed over the entire surface including the bit line contact hole 17 including the spacer 20a. Thereafter, after a mask pattern (not shown) defining a bit line is formed over the bit line hard mask layer 30b, and the above-mentioned laminated structure is etched using the mask pattern (not shown) as an etch mask, so that a bit line contact plug 25 and a bit line 30 are formed.

Subsequently, a second spacer 35 is formed over the entire surface including the bit line 30 and the bit line contact plug 25. The second spacer 35 fills in an empty space formed at a side of the bit line contact plug 25. However, as the depth of the bit line contact hole 17 increases, the corresponding depth (d1) (See FIG. 1C) of the second spacer 35 also increases. Therefore, the second spacer 35 is unlikely to completely fill the bit line contact hole 17, resulting in a void.

Figure 1D:
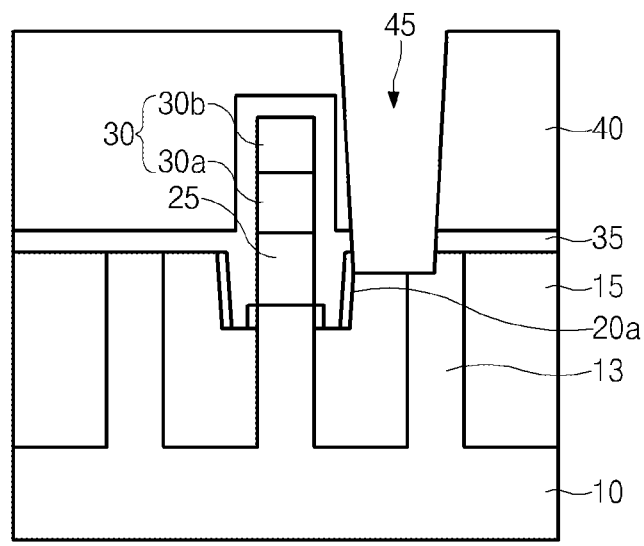

Referring to FIG. 1D, an interlayer insulation film 40 is formed over the second spacer 35, and a storage node contact hole 45 is formed by etching the interlayer insulation film 40 and the second spacer 35 formed over the semiconductor substrate 10.

Figure 2:
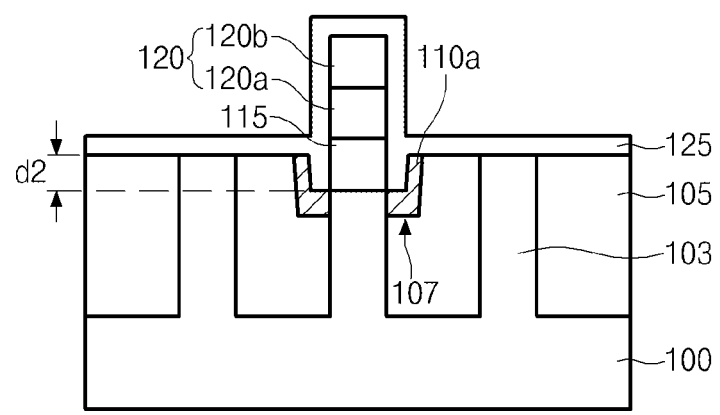
FIG. 2 is a cross-sectional view illustrating a semiconductor device according to an embodiment of the present invention.

FIG. 2 is a cross-sectional view illustrating a semiconductor device according to an embodiment of the present invention.

Referring to FIG. 2, a bit line contact hole 107 is formed in the semiconductor substrate 100 including the active region 103 and the device isolation film 105. The active region 103 may protrude from a center part of the bit line contact hole 107. The active region 103 shown in FIG. 2 shows a cross-sectional view of the active region 103 taken along a short-axis of the active region 103.

In addition, a first spacer 110a is formed over sidewalls and the bottom of the bit line contact hole 107. In an embodiment, the first spacer 110a may include a nitride film. The portion of the first spacer 110a that is formed at the bottom of the bit line contact hole 107 is formed to be thicker than the portion of the first spacer 110a that is formed over the sidewalls of the bit line contact hole 107. In addition, the portion of the first spacer 110a that is formed at the bottom of the bit line contact hole 107 is formed in such a manner that a surface of the protruded active region 103 is exposed. That is, in an embodiment, the portion of the first spacer 110a that is formed at the bottom of the bit line contact hole 107 may be formed to be level with a top of the protruded active region 103.

In addition, a bit line contact plug 115 and a bit line 120 are formed over the active region 103. The bit line contact plug 115 may include polysilicon, and the bit line 120 may include a barrier metal layer (not shown), a bit line conductive layer 120a and a bit line hard mask layer 120b. In an embodiment, the bit line contact hole 107 may not be completely filled, resulting in a void at a side of the bit line contact plug 115. A second spacer 125 is formed over the entire surface of the semiconductor substrate 100 including the bit line contact plug 115 and the bit line 120. In an embodiment, the second spacer 125 may include a nitride film, and may fill in the void which may be formed at a side of the bit line contact plug 115.

As described above, since the first spacer 110a is formed at the bottom of the bit line contact hole 107, the depth (d2) corresponding to a gap-filled depth of the second spacer 125 is reduced. As a result, when a storage node contact hole is formed in a subsequent process, a SAC fail can be prevented.

FIGS. 3A to 3G are cross-sectional views illustrating a method for manufacturing a semiconductor device shown in FIG. 2 according to an embodiment of the present invention.

Figure 3A:
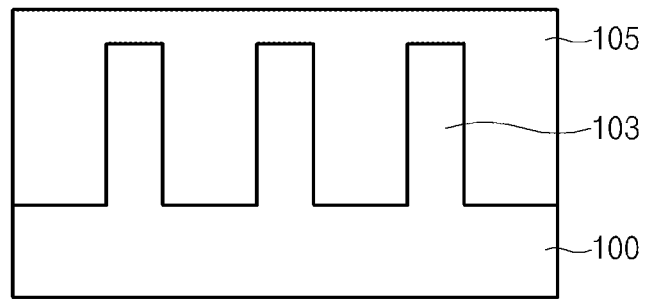
FIGS. 3A to 3G are cross-sectional views illustrating a method for manufacturing the semiconductor device shown in FIG. 2.

Referring to FIG. 3A, a semiconductor substrate 100 is etched so that a device isolation trench for defining the active region 103 is formed. Thereafter, the device isolation trench is filled with an oxide film, and a planarization etching process is performed, so that a device isolation film 105 is formed.

Figure 3B:
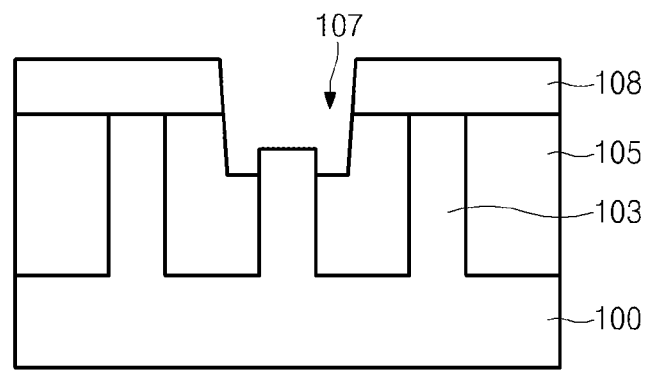

Referring to FIG. 3B, a mask pattern 108 is formed over the semiconductor substrate 100. Thereafter, the semiconductor substrate 100 is etched using the mask pattern 108 as an etch mask so that a bit line contact hole 107 is formed. In an embodiment, the active region 103 may protrude from a center part of the bit line contact hole 107 due to a difference in etch selection ratio between the active region 103 and the device isolation film 105. The active region 103 shown in FIGS. 3A to 3G is a cross-sectional view taken along a short-axis of the active region 103.

Figure 3C:
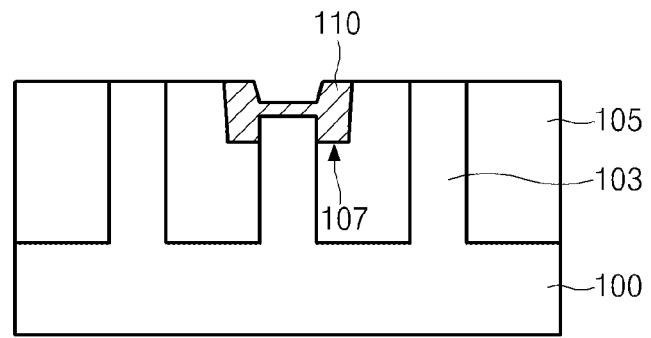

Referring to FIG. 3C, after the mask pattern 108 is removed, a spacer insulation film 110 is deposited in the bit line contact hole 107. Preferably, the spacer insulation film 110 may be formed of a material including a nitride film. In an embodiment, the spacer insulation film 110 is deposited along sidewalls of the bit line contact hole 107 and over the protruded active region 103, so as to form a recess over the protruded active region 103 as shown in FIG. 3C.

Figure 3D:
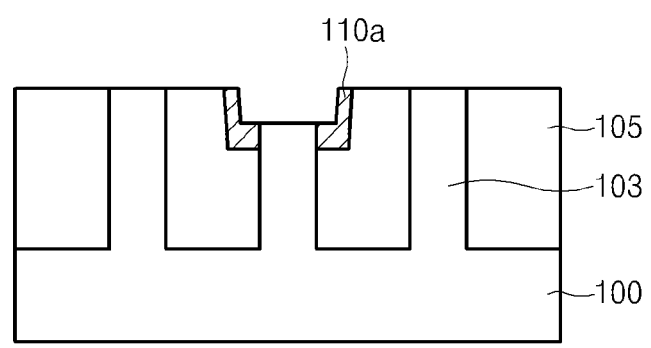

Referring to FIG. 3D, a lateral etch process is performed so that the spacer insulation film 110 remains only over the sidewalls and bottom of the bit line contact hole 107. The remaining spacer insulation film 110 is referred to as a first spacer 110a. The spacer insulation film 110 may be etched until the top of the active region 103 is exposed during the lateral etch process. Therefore, the first spacer 110a may be formed at a sidewall of the bit line contact hole 107. A light etch treatment (LET) scheme may be employed for the lateral etch process. More preferably, a wet etch scheme may be employed, or a lateral etch process may be performed using a gas, including any of $SF_6$, $O_2$, $N_2$, HBr and a combination thereof. In this case, the LET scheme may be performed using a mixed gas of $CF_4$ and $O_2$ through a downstream-based etching device. A LET process is advantageous because it cures a substrate surface, which is damaged in the etching process.

In addition, the lateral etch process is performed until the top of the active region 103 is exposed. That is, the first spacer 110a is formed to expose the top surface of the active region 103, which protrudes in the bit line contact hole 107. Preferably, the first spacer 110a formed at the bottom of the bit line contact hole 107 may be formed to be the level to a top surface of the protruded active region 103. Preferably, the portion of the first spacer 110a formed at the bottom of the bit line contact hole 107 may be formed to have a larger thickness than the portion of the first spacer 110a formed at a sidewall of the bit line contact hole 107.

Figure 3E:
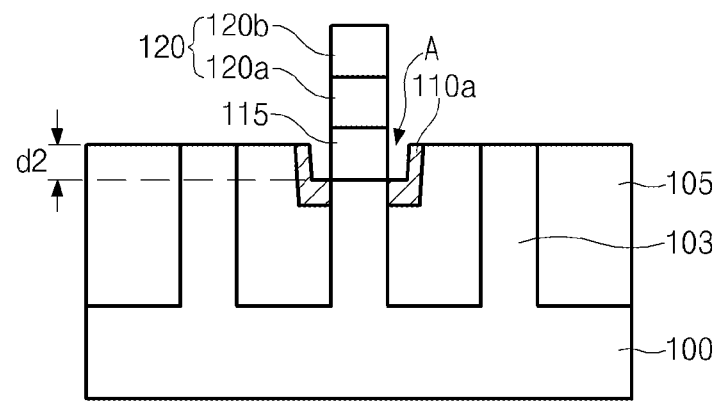

Referring to FIG. 3E, a polysilicon layer, a barrier metal layer (not shown), a bit line conductive layer 120a, and a bit line hard mask layer 120b are sequentially formed over the entire surface of the semiconductor substrate 100 including the bit line contact hole 107 in which the first spacer 110a is formed. After that, a mask pattern (not shown) defining a bit line is formed over the bit line hard mask layer 120b. The bit line hard mask layer 120b, the bit line conductive layer 120a, the barrier metal layer (not shown) and the polysilicon layer are etched using the above-mentioned mask pattern (not shown) as an etch mask, so that the bit line 120 and the bit line contact plug 115 are formed. In other words, the bit line 120 and the bit line contact plug 115 are simultaneously etched. The bit line contact plug 115 may be formed by etching the polysilicon layer. Thus, an inner GBL (Global Bit Line), including the bit line contact plug 115, is formed in the bit line contact hole 107, and an empty space, denoted as 'A', is formed between a lateral surface of the bit line contact plug 115 and the first spacer 110a formed at a sidewall of the bit line contact hole 107.

Figure 3F:
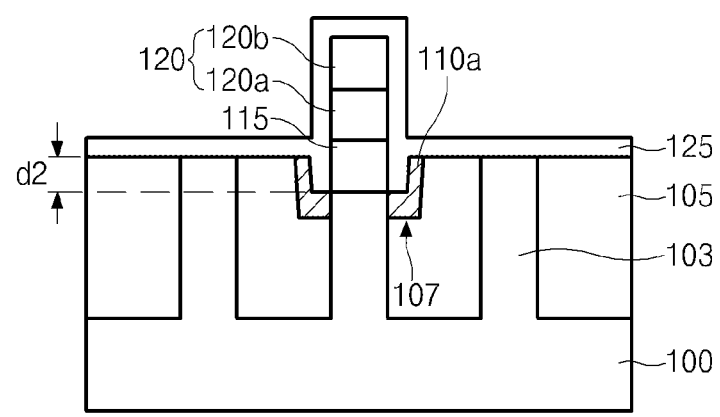

Referring to FIG. 3F, a second spacer 125 is formed over the entire surface of the semiconductor substrate 100 including the bit line contact plug 115 and the bit line 120. The second spacer 125 fully fills the empty space A shown in FIG. 3E. In this case, since the first spacer 110a is formed to a predetermined thickness at the bottom of the bit line contact hole 107, the depth (d2) filled by the second spacer 125 becomes shallower, so that a gap-filling problem caused by a high aspect ratio during the formation of the second spacer 125 can be solved. The second spacer 125 may be formed of the same material as the first spacer 110a. For example, the second spacer 125 may be formed of a material including a nitride film.

Figure 3G:
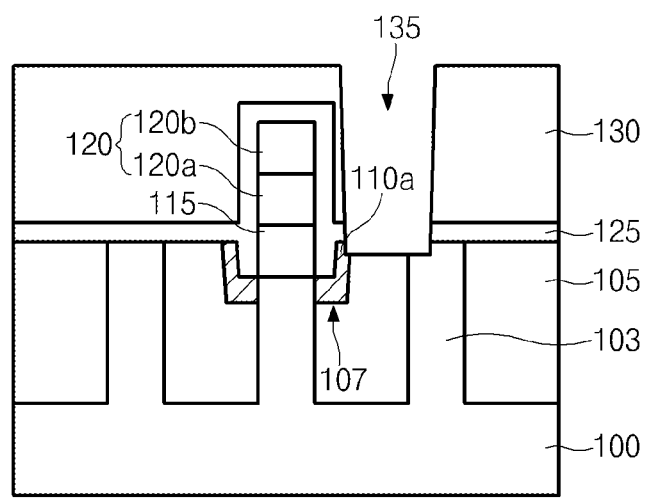

Referring to FIG. 3G, an interlayer insulation film 130 is formed over the entire surface including the second spacer 125. Thereafter, a mask pattern (not shown) defining a storage node contact hole is formed over the interlayer insulation film 130, and the interlayer insulation film 130 and the second spacer 125 are etched using the above-mentioned mask pattern (not shown) as an etch mask, so that a storage node contact hole 135 is formed and a cleaning process is then performed. The interlayer insulation film 130 is formed of a material, such as an oxide film, that has an etch selectivity ratio different from that of the spacer insulation film 125. As a result, the second spacer 125 formed at sidewalls of the bit line 120 is not damaged and damage to the bit line 120 and the bit line contact plug 115 can be prevented. As can be seen from FIG. 3F, the second spacer 125 can fill a void between the bit line contact plug 115 and the first spacer 110a, preventing a Self Align Contact (SAC) fail from occurring in the course of formation of the storage node contact hole 135.

As is apparent from the above description, a semiconductor device and a method for forming the same according to an embodiment of the present invention, the first spacer is formed at the bottom of the bit line contact hole, and the resultant first spacer is increased in thickness, so that the depth of the second spacer, which is deposited after the formation of the bit line and the bit line contact plug and fills a void between the bit line contact plug and the first spacer, is reduced. As a result, formation of a void can be prevented in the formation of the second spacer, and a SAC fail can also be prevented in the formation of the storage node contact hole, which is formed in a subsequent process.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device comprising:
   a bit line contact hole including an active region that protrudes further from a substrate than a portion of device isolation film directly adjacent to the active region;
   a first spacer formed over a sidewall and an entire bottom surface of the bit line contact hole so as to expose an upper surface of the active region;
   a bit line contact plug and a bit line formed over the exposed active region; and
   a second spacer formed between the bit line contact plug and the first spacer.

2. The semiconductor device according to claim 1, wherein each of the first spacer and the second spacer includes a nitride film.

3. The semiconductor device according to claim 1, wherein a surface of the first spacer formed over the bottom of the bit line contact hole is substantially level to a surface of the protruded active region.

4. The semiconductor device according to claim 1, wherein a width of the bit line contact hole is larger than a short-axis length of the active region.

5. The semiconductor device according to claim 1, wherein a width of the bit line contact plug is smaller than a width of the bit line contact hole.

6. The semiconductor device according to claim 1, wherein the bit line contact plug includes polysilicon.

7. The semiconductor device according to claim 1, wherein the bit line comprises a laminated structure including a barrier metal layer, a bit line conductive layer, and a hard mask layer.

8. The semiconductor device according to claim 1, wherein the second spacer further extends along a sidewall of the bit line contact plug.

9. The semiconductor device according to claim 1, wherein a portion of the first spacer disposed over the bottom of the bit line contact hole has a larger thickness than a portion of the first spacer disposed over the sidewall of the bit line contact hole.

10. A semiconductor device comprising:
   a trench disposed in a substrate, wherein a bottom of the trench is at a first level;
   an active region uplifted from a substrate more than a portion of device isolation film directly adjacent to the active region and disposed in the trench, wherein a top of the active region is at a second level higher than the first level;
   a bit line pattern disposed over the active region and coupled to the active region;
   a first spacer disposed over an entire bottom of the trench and extending over a sidewall of the trench, wherein a top of the first spacer formed over the bottom of the trench is at a third level, wherein the first spacer fills a space between the active region and the device isolation film; and
   a second spacer disposed between the first spacer and the bit line pattern.

11. The semiconductor device of claim 10, wherein the third level is substantially the same as the second level.

12. The semiconductor device of claim 10, wherein the first level is defined by a top of the isolation film, and sidewalls of the trench are defined by sidewalls of the device isolation film.

* * * * *